(12) United States Patent
Robidoux (10) Patent No.: US 10,743,443 B2
(45) Date of Patent: Aug. 11, 2020

(54) DEVICE AND METHOD FOR NOISE SUPPRESSION OF ELECTRICAL SIGNALS

(71) Applicant: Daniel Robidoux, Montreal (CA)

(72) Inventor: Daniel Robidoux, Montreal (CA)

( * ) Notice: Subject to any disclaimer, the term of this patent is extended or adjusted under 35 U.S.C. 154(b) by 0 days.

(21) Appl. No.: 16/599,961

(22) Filed: Oct. 11, 2019

(65) Prior Publication Data

US 2020/0128703 A1     Apr. 23, 2020

Related U.S. Application Data

(60) Provisional application No. 62/746,774, filed on Oct. 17, 2018.

(51) Int. Cl.
*H05K 9/00*     (2006.01)

(52) U.S. Cl.
CPC ......... *H05K 9/0083* (2013.01); *H05K 9/0098* (2013.01)

(58) Field of Classification Search
CPC ............................ H05K 9/0083; H05K 9/0098
USPC ....................................................... 174/388
See application file for complete search history.

(56) References Cited

U.S. PATENT DOCUMENTS 2,991,293 A * 7/1961 Batzer .................. C08G 18/003
549/367

* cited by examiner

*Primary Examiner* — Timothy J Thompson
*Assistant Examiner* — Michael F McAllister
(74) *Attorney, Agent, or Firm* — Norton Rose Fulbright Canada LLP (57) ABSTRACT

A power distribution device comprising a supporting structure having a power input connector mounted to the supporting structure, the power input connector having at least two input contacts and a power output connector mounted to the supporting structure, the power output connector having at least two output contacts corresponding to the at least two input contacts. A plurality of elongated filters are mounted inside the supporting structure, each one of the filters comprising a hollow casing filled with a mixture composed of quartz and bitumen emulsion, wherein a percent of bitumen emulsion of a total volume of the mixture is greater than 0% and no more than 50%. Wire connections define first electric paths from the input contacts to the elongated filters and second electric paths from the elongated filters to the output contacts.

13 Claims, 6 Drawing Sheets

DEVICE AND METHOD FOR NOISE SUPPRESSION OF ELECTRICAL SIGNALS

CROSS-REFERENCE TO RELATED APPLICATIONS

The present application claims the benefit of U.S. Provisional Patent Application No. 62/746,774 filed on Oct. 17, 2018, the contents of which are hereby incorporated by reference in their entirety.

TECHNICAL FIELD

The present disclosure relates generally to noise suppression of electrical signals, and more particularly, to noise suppression and/or reduction when performing power distribution.

BACKGROUND OF THE ART

There are many possible sources of noise in an electric circuit. For example, the transmission of data through a circuit requires electric current, which creates an electromagnetic field. The electromagnetic field may interfere with other signals in the circuit, thus resulting in electromagnetic interference (EMI). Another possible source of noise is contact noise, which occurs at a point of contact when a current source is turned on/off with a switch. This is a common phenomenon in a power supply. Noise may also be caused due to an electrostatic discharge, also referred to as a surge. Regardless of the source, noise is a factor that needs to be considered in most electric circuits.

Various suppression techniques are used to address noise, for example with the use of shields and filters. Sometimes noise suppression techniques are used directly inside the electric circuit and considered during the design phase. This is usually done to ensure that the noise does not interfere with circuit components and functions within the system. Sometimes noise suppression techniques are used post-design, for example to ensure that a product containing the electric circuit does not emit noise that could interfere with other equipment in the vicinity of the product.

There are certain instances where noise suppression has a negative impact on the electric signal, for example in certain types of audio or video signals. Indeed, suppressing noise may affect the sound dynamic of an audio signal or the vibrancy of the colors of an image, thus affecting the user experience. There is therefore a need to improve on existing noise suppression techniques.

SUMMARY

In accordance with a broad aspect, there is provided power distribution device. The device comprises a supporting structure having a power input connector mounted to the supporting structure, the power input connector having at least two input contacts and a power output connector mounted to the supporting structure, the power output connector having at least two output contacts corresponding to the at least two input contacts. A plurality of elongated filters are mounted inside the supporting structure, each one of the filters comprising a hollow casing filled with a mixture composed of quartz and bitumen emulsion, wherein a percent of bitumen emulsion of a total volume of the mixture is greater than 0% and no more than 50%. Wire connections define first electric paths from the input contacts to the elongated filters and second electric paths from the elongated filters to the output contacts.

In accordance with another broad aspect, there is provided a method for suppressing noise in an electrical signal. The method comprises receiving alternating current at a power distribution device through a power input connector having at least two input contacts, filtering the alternating current through a plurality of elongated filters inside the power distribution device, each one of the filters comprising a hollow casing filled with a mixture composed of quartz and bitumen emulsion, wherein a percent of bitumen emulsion of a total volume of the mixture is greater than 0% and no more than 50%, and distributing the filtered alternating current through a power output connector having at least two output contacts corresponding to the at least two input contacts.

Features of the systems, devices, and methods described herein may be used in various combinations, in accordance with the embodiments described herein.

BRIEF DESCRIPTION OF THE DRAWINGS

Reference is now made to the accompanying figures in which.

It will be noted that throughout the appended drawings, like features are identified by like reference numerals.

DETAILED DESCRIPTION

Figure 1:
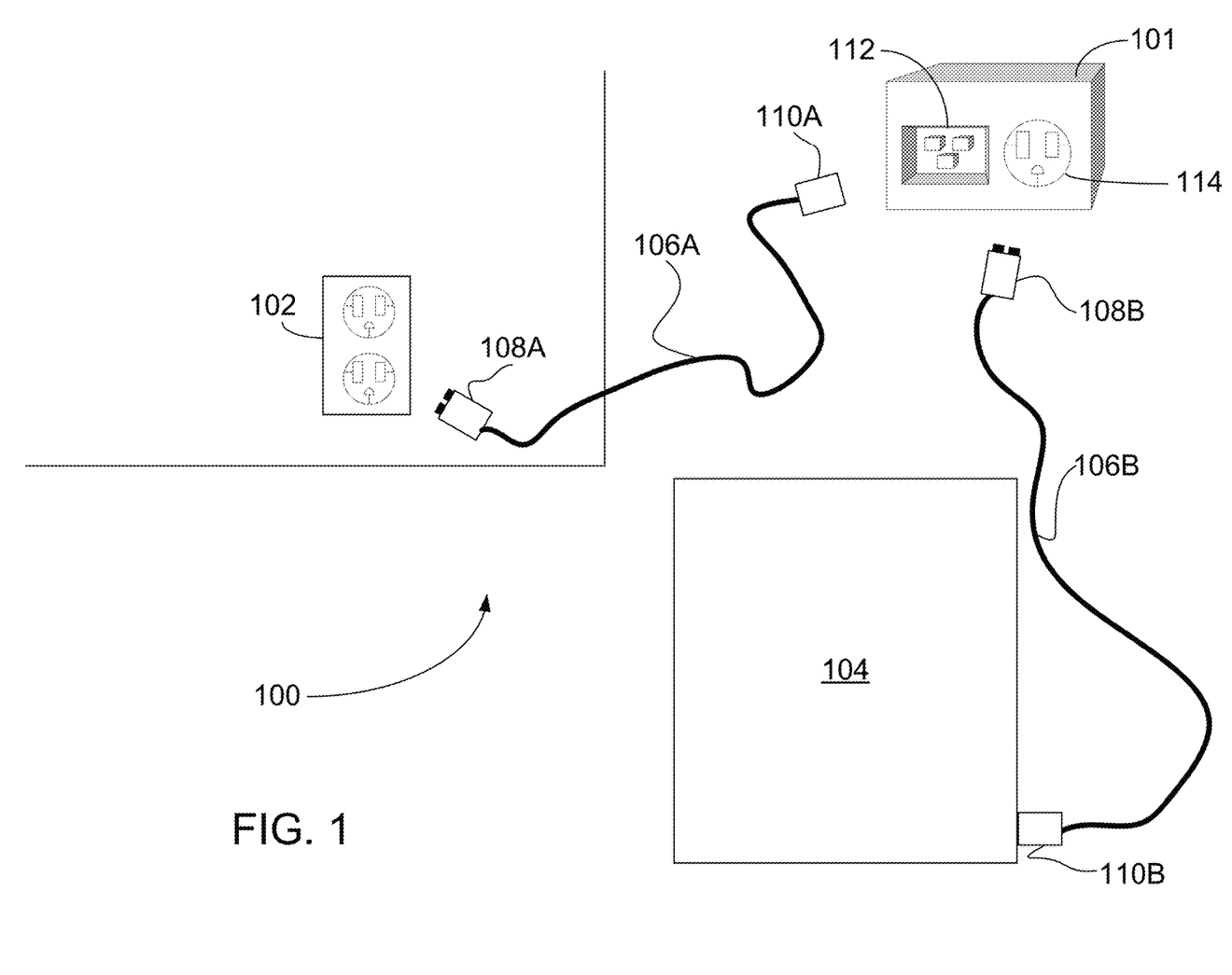
FIG. 1 is a schematic of a system in which a power distribution device is used, in accordance with an illustrative embodiment.

FIG. 1 illustrates an example system 100 comprising a power distribution device 101. In this example, the power distribution device 101 is connected between a wall outlet 102 and an electronic device 104. The electronic device 104 may be any electronic device requiring power and for which it is desired to apply noise suppression and/or reduction. Many examples may be found in the audio and video industry, such as but not limited to a television, a speaker, a projector, a power amplifier, a turntable, a video processor, a pre-amplifier, and a digital-to-analog converter. Many other examples exist in the audio and video industry. The power distribution device 101 is also applicable outside of the audio and video industry, for example for computer systems, appliances, power tools, lighting, and the like.

The power distribution device 101 is connected to the wall outlet 102 via a first cable 106a, having a male connector 108a and a female connector 110a. The male connector 108a is received into a socket of the wall outlet 102. The female connector 110a mates with a power input connector 112 of the power distribution device 101. Alternating current (AC) power is provided to the power distribution device 101 through the first cable 106a from the wall outlet 102. In some embodiments, the AC power is provided from a separate device instead of through a wall outlet 102, such as from a stand-alone power supply. Other embodiments may also apply.

A second cable 106b connects the power distribution device 101 to the electronic device 104. The second cable 106 comprises a male connector 108b that mates with a power output connector 114 of the power distribution device 101. A female connector 108b mates with another connector (not shown) on the electronic device 104. The AC power is provided to the electronic device 104 through the power distribution device 101. Noise suppression and/or reduction is applied to the AC power in the power distribution device 101 before being sent to the electronic device 104.

Figure 2:
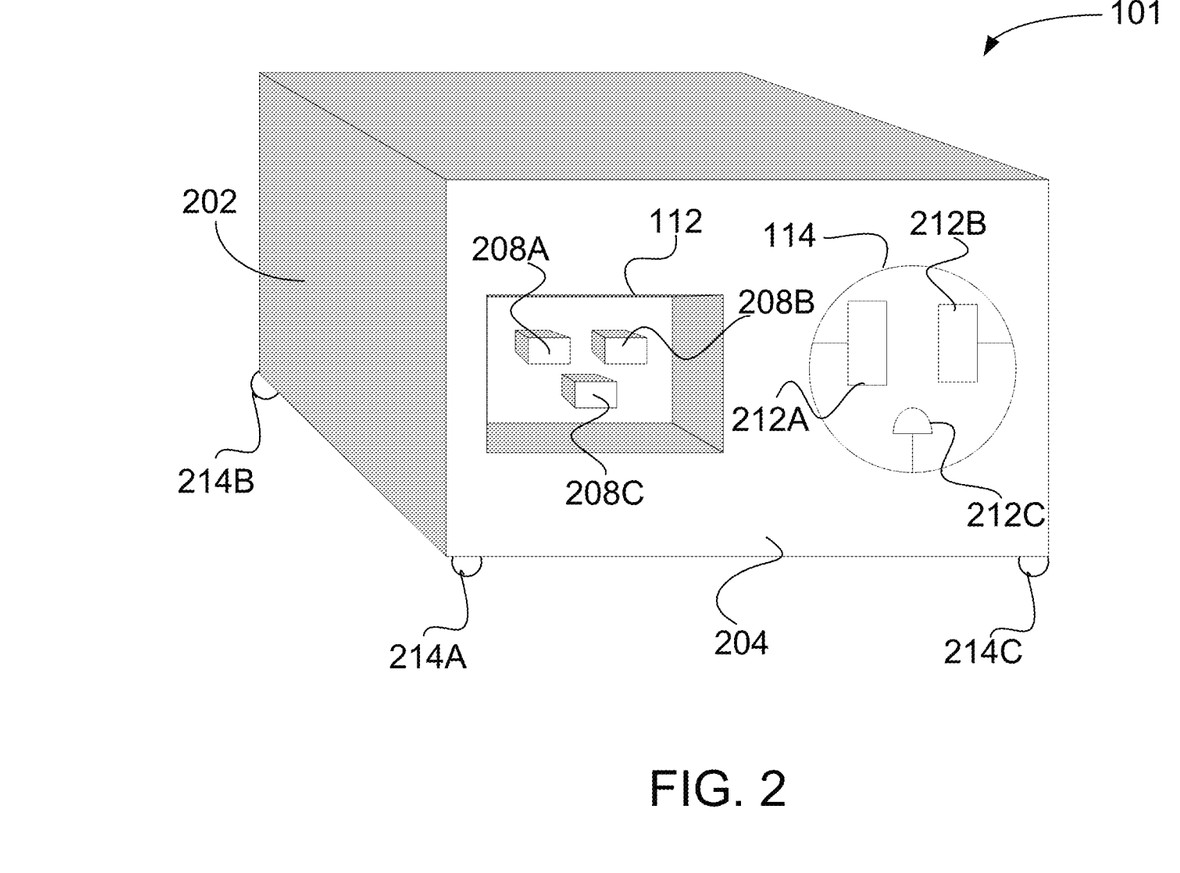
FIG. 2 is an enlarged view of a power distribution device, in accordance with an illustrative embodiment.

Referring to FIG. 2, there is illustrated an enlarged view of the power distribution device 101. The device 101 may be used to reduce and/or eliminate electrical noise, electromechanical noise, and/or mechanical noise. Examples of electrical noise are electromechanical interference (EMI) and radio frequency interference (RFI). Electrical noise may not be audible to the human ear and includes any unwanted variation in an electrical signal. Some possible sources of electrical noise are capacitive or electrostatic coupling, inductive coupling, thermal noise, shot noise, and flicker noise. Examples of electromechanical noise sources are transformers, non-polarized capacitors, and coils in switching power supplies. Examples of mechanical noise are motors driving a compact disc or turntable belt, movable parts, and other components that may cause audible noise and/or vibrations on the system.

The power input connector 112 and power output connector 114 are mounted to a supporting structure. In the example illustrated, the supporting structure is a housing 202 having one or more outer surface 204. The housing 202 is box-shaped and has four side walls, a bottom wall, and a top wall. In other embodiments, the housing 202 may be of a different shape, such as circular, cylindrical, triangular, and any geometric or non-geometric shape having at least one outer surface. Other supporting structures may also be used instead of a closed housing, such as a frame or an open base. The supporting structure may be made of various materials. In some embodiments, the material is chosen to be flexible, such as nylon, PVC, graphite, fiberglass, and neoprene. In some embodiments, the supporting structure is made of ballistic nylon. In some embodiments, support members 214a, 214b, 214c are provided underneath the supporting structure. The support members 214a, 214b, 214c may be made of rubber, wood, Corian™, aluminum or other materials in order to help attenuate vibrations. In some embodiments, the support members 214a, 214b, 214c are made of stainless steel and incorporate a ball bearing system that transforms mechanical vibrations into heat.

The power input connector 112 is provided on the outer surface 204 and has at least two input contacts for mating with the connector 110a of the first cable 106a. In the embodiment illustrated, the contacts are prongs, namely a first prong 208a, a second prong 208b, and a third prong 208c that extend outside of the housing 202. The first and second prongs 208a, 208b are positive and negative contacts, respectively, while the third prong 208c is a grounding contact. The prongs 208a, 208b, 208c may be rectangular-shaped, as illustrated, or they may be round, square, or any other shape suitable to mate with a corresponding connector of a cable. The prongs 208a, 208b, 208c may be of a same length or of varying lengths. In some embodiments, the prongs 208a, 208b for the positive and negative contacts are of a same length while the prong 208c for the ground is of a different length.

More or less than three input contacts may be provided on the power input connector 112 as a function of the standard for which the apparatus 100 is adapted. For example, there may be only two input contacts corresponding to neutral and line, respectively. While illustrated as prongs, the input contacts may also be provided as slots or as a combination of slots and prongs.

The power input connector 112 may be embedded in a wall of the housing 202, such as outer surface 204. The portion of the power input connector 112 accessible from the outside of the housing 202 is referred to herein as the frontend of the connector 112. The frontend may have various shapes, such as square, rectangular, circular, and the like. The frontend may be recessed from (as illustrated), protruding from, or flat with the outer surface 204. A backend of the power input connector 112 is accessible from the inside the enclosure of the housing 202, as will be described in more detail below.

In some embodiments, the power input connector 112 has a voltage and frequency compatible with the European standard of 220-240 volts at 50 Hz. In some embodiments, the power input connector 112 has a voltage and frequency compatible with the North American standard of 120 volts at 60 Hz. In some embodiments, the power input connector 112 has a voltage and frequency compatible with the Japanese standard of 100 volts at either 50 Hz or 60 Hz. The power input connector 112 may also be configured for any other standards, such as but not limited to the Australasian standard, the Argentina standard, the Brazilian standard, the British standard, the Chinese standard, and the like. In some embodiments, the voltage and frequency ratings of the power input connector 112 are not compatible with any specific standard.

The power output connector 114 is mounted to the supporting structure of the power distribution device 101, such as the housing 202, and has at least two output contacts. In some embodiments, the output contacts correspond to slots 212a (positive), 212b (negative), 212c (ground). Alternatively, only slots 212a (line) and 212b (neutral) are provided. Other configurations for the contacts of the power output connector 114 may also be used, including a combination of prongs and slots or only prongs. In some embodiments, the power output connector 114 is a universal connector compatible with many different configurations of connectors.

The power output connector 114 is shown to be mounted to the same outer surface 204 as the power input connector 112. It should be understood that the power input connector 112 and the power output connector 114 may be mounted to different surfaces of a supporting structure, such as different walls of a housing 202.

Figure 3:
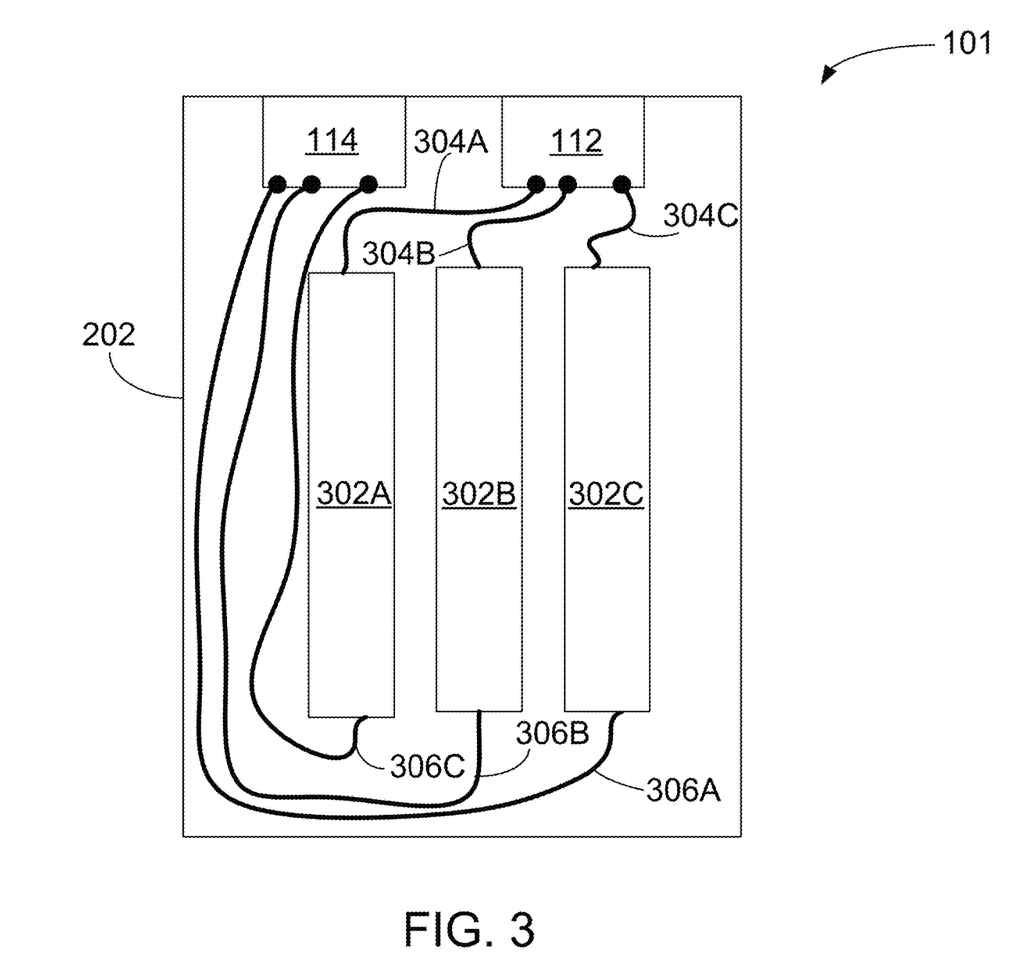
FIG. 3 is a cross-sectional top view of the power distribution device, in accordance with an illustrative embodiment.

FIG. 3 is a top cross-sectional view of an embodiment of the power distribution device 101. The housing 202 defines an enclosure and the backend of the power input connector 112 and the power output connector 114 are accessible in the enclosure. A plurality of elongated filters 302a, 302b, 302c are mounted inside the supporting structure and connected to the power input connector 112 and the power output connector 114.

Wire connections define electric paths from the input contacts at the backend of the power input connector 112, through the elongated filters 302a, 302b, 302c, and to the output contacts of the power output connector 114. First electric paths 304a, 304b, 304c are formed between the power input connector 112 and the elongated filters 302a, 302b, 302c. For a power input connector 112 having three input contacts, a first input contact is connected to a first filter 302a via electric path 304a, a second input contact is connected to a second filter 302b via electric path 304b, and a third input contact is connected to a third filter 302c via electric path 304c. Second electric paths 306a, 306b, 306c are formed between the elongated filters 302a, 302b, 302c and the power output connecter 114. For a power output connector 114 having three output contacts, the first filter 302a is connected to the first output contact via electric path 306a, the second filter 302b is connected to the second output contact via electric path 306b, and the third filter 302c is connected to the third output contact via electric path 306c. As such, an electric signal flowing into the power input connector 112 through each one of its input contacts flows through an electric path into an elongated filter, flows out of the elongated filter, and flows to a corresponding output contact of the power output connector 114 through another electric path.

In some embodiments, the wire connections are soldered directly onto the backend of the input power connector 112 and the output power connector 114. Alternatively, a removable connection is used to place the wires into contact with the input and output contacts. In some embodiments, the wire connections are cryogenic cables.

While three elongated filters 302a, 302b, 302c are illustrated in the embodiment of FIG. 3, it will be understood that the number of filters is at least equal to the number of input and output contacts on the power input and output connectors 112, 114, respectively. This is to ensure that noise suppression and/or reduction is applied independently to each portion of the incoming electric signal.

The elongated filters 302a, 302b, 302c are mounted inside the supporting structure of the power distribution device 101. Each filter comprises a hollow casing filled with a mixture composed of quartz and bitumen emulsion. The bitumen emulsion may be a cationic bitumen emulsion or anionic bitumen emulsion such as produced for example by RAHA BITUMEN Company (Iran). However, the invention should not be limited to the bitumen emulsion from a specific provider as any bitumen emulsion is suitable.

Figure 4:
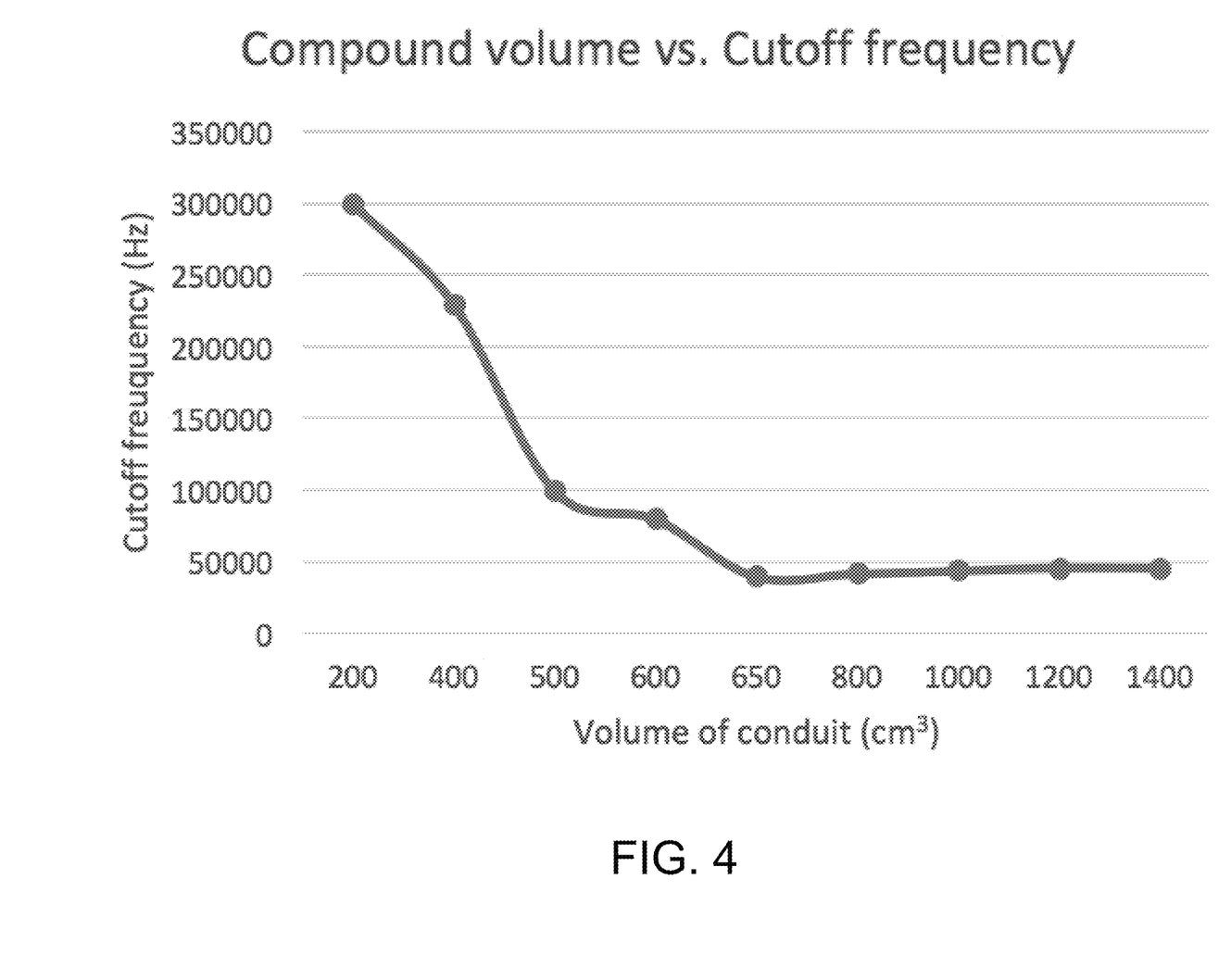
FIG. 4 is an example graph of mixture volume vs cut-off frequency.

The casings may be of various shapes, such as cylindrical, rectangular, and the like. The casings are sized for a given volume in order to obtain a desired cut-off frequency. Referring to FIG. 4, there is illustrated an example curve of cut-off frequency in Hz for a range of casing volumes, in cubic centimeters. The elongated filters 302a, 302b, 302c act as low-pass filters and the cut-off frequency is the frequency above which signals get attenuated. As shown, the smaller the volume, the higher the cut-off frequency. There is therefore a trade-off between the desired cut-off frequency and the size of the device. It can also be seen from the graph that above a certain volume, for example about 650 cm³, there is very little gain in terms of cut-off frequency. The casings may thus vary in size. The length may be from 20 to 50 cm in length with a diameter of 50 mm in order to obtain a volume between 400 and 650 cm³. The diameter may be from 40 to 50 mm with a length of 33 cm to obtain a volume between 400 cm³ and 650 cm³. In some embodiments, the casings are cylindrical, have a length of 33 cm, and a diameter of 50 mm, for a volume of about 648 cm³. The casings may be of various materials, such as carbon fiber, and other rigid and electrically conductive materials.

Figure 5:
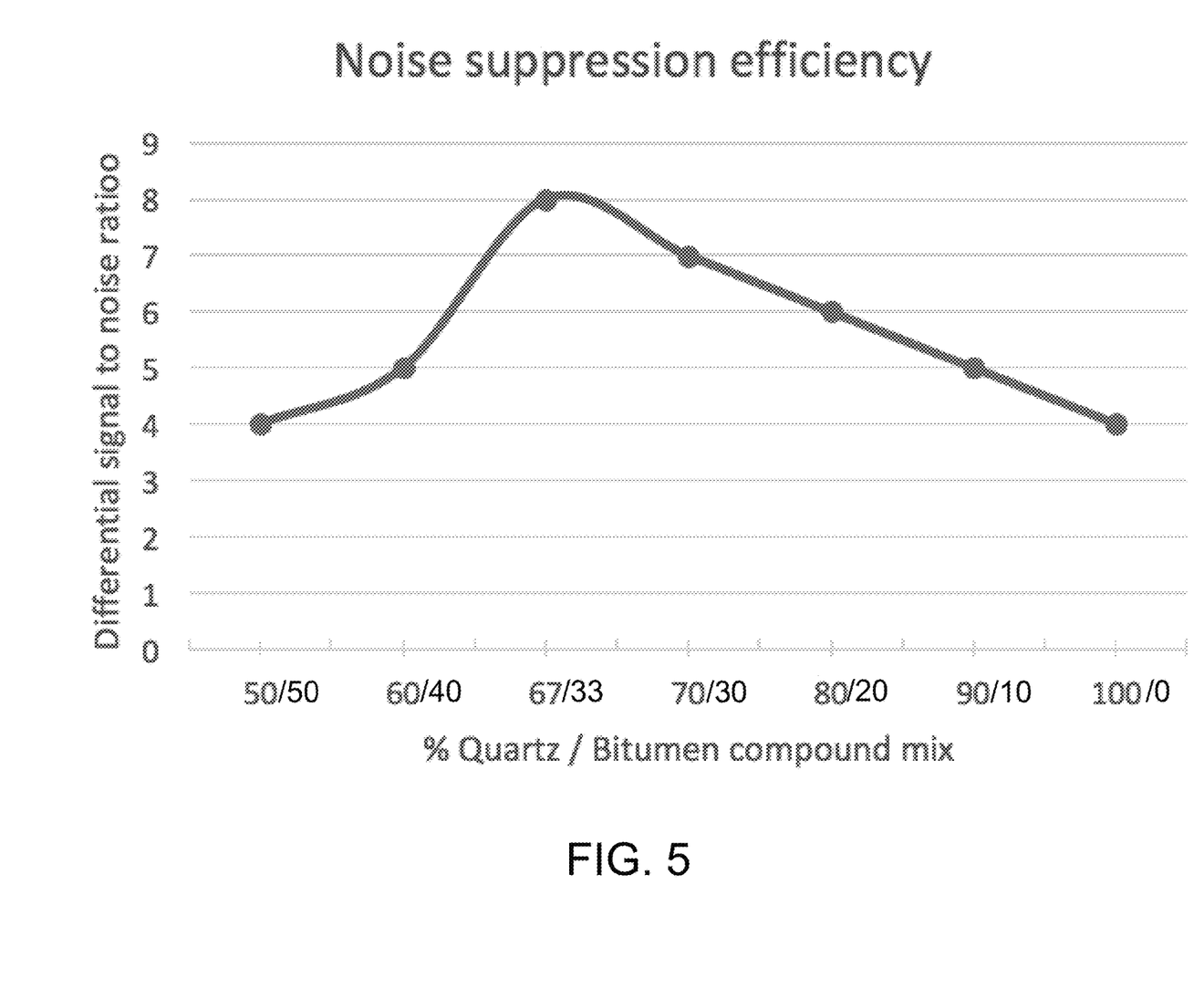
FIG. 5 is an example graph of mixture ratio vs. differential SNR.

When the electric signal flows through the filters 302a, 302b, 302c, the mixture of quartz and bitumen emulsion is magnetized and acts like a ferrite core to impede or filter out noise caused by high frequencies. The current flows through the casing and parasitic electro-magnetic waves are filtered out by the mixture of quartz and bitumen. The ratio of quartz to bitumen is selected according to two criteria: viscosity and performance. Viscosity refers to the manufacturability of the elongated filter, or the feasibility of introducing the mixture into the hollow tube. A viscosity too high results in a mixture that is too thick. A viscosity too low results in mixture that is too liquid. Performance refers to the effect of the bitumen emulsion on the quartz. The dielectric permittivity of quartz is lowered by the bitumen emulsion and thus its noise suppression capability is increased. However, too much bitumen emulsion may result in having the quartz molecules spaced too far apart to become magnetized when the electric signal is applied, thus decreasing its noise suppression capability. An optimal mixture of quartz and bitumen emulsion will allow the quartz molecules to be sufficiently coated with the bitumen emulsion without spacing them too far apart. Referring to FIG. 5, noise suppression efficiency is illustrated by plotting differential signal to noise ratio (SNR) for different quartz/bitumen ratios in % of total volume. As shown, the noise suppression efficiency varies between ratios of 50% quartz for 50% bitumen and 100% quartz for 0% bitumen, with a peak at about 67% quartz for 33% bitumen. In some embodiments, the ratio of quartz to bitumen in % of volume is between 60/40 and 90/10. In some embodiments, the ratio of quartz to bitumen in % of volume is between 65/35 and 80/20. In some embodiments, the ratio of quartz to bitumen in % of volume is between 66/34 and 70/30. In some embodiments, the ratio of quartz to bitumen in % of volume is 67/33. Other ratios may also be used, wherein the percent of bitumen emulsion of the total volume of the mixture is greater than 0% and no more than 50%.

Figure 6:
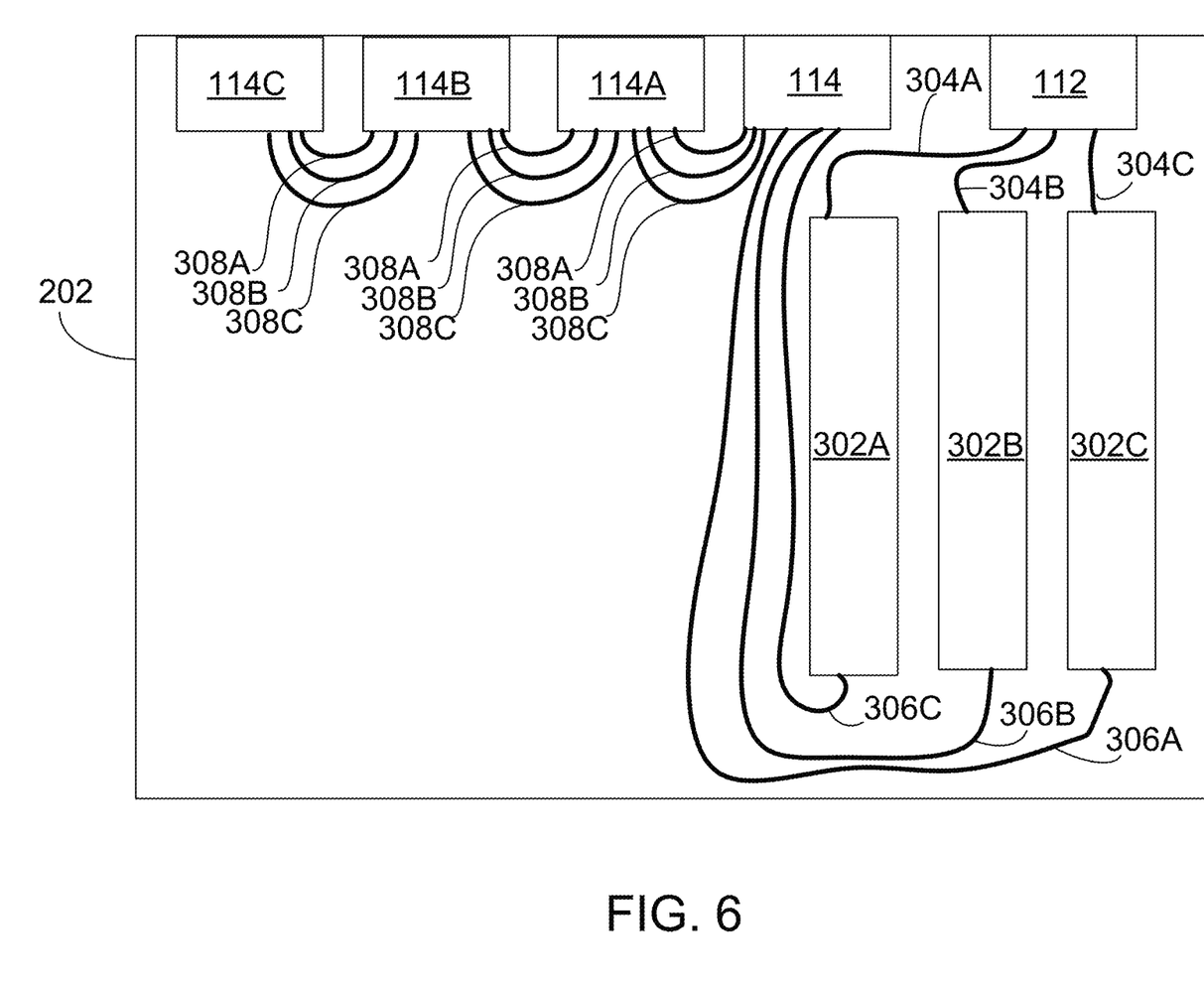
FIG. 6 is a cross-sectional top view of the power distribution device, in accordance with another illustrative embodiment.

In some embodiments, more than one power output connector 114 is provided on the power distribution device 101, thus allowing multiple electronic devices 104 to be simultaneously powered by the AC power source. An example embodiment is illustrated in FIG. 6, where in addition to power output connector 114, three more power output connectors 114a, 114b, 114c are also provided. The power output connectors 114, 114a, 114b, 114c are connected together via third electric paths 308a, 308b, 308c, effectively connecting together any electronic device 104 connected to the power distribution device 101. More or less than three additional power output connectors 114a, 114b, 114c may be provided.

First, second, and third electric paths are composed of sets of wires to join components together. The number of wires in each set corresponds to the number of input and output contacts on the input and output connectors 112, 114. Each wire may itself be formed of one or more conductor, for example a twisted pair cable. Multiple conductors may also be used together, with or without twisting, in a shielding, to form the electric paths. In some embodiments, a litz wire is used to mitigate the skin effect for certain frequencies. The wires may be of various gauge sizes, such as but not limited to gauge 2 (6.54304 mm in diameter) to gauge 6 (4.11480 mm in diameter). In some embodiments, the wires are gauge 4 (5.189922 mm in diameter).

In some embodiments, the entire power distribution device 101 is constructed using point-to-point connections, without any printed circuit boards provided therein.

The present invention will be more readily understood by referring to the following example which is given to illustrate the invention rather than to limit its scope.

EXAMPLE 1

Noise Reduction Achieved

In order to demonstrate the superiority of the mixture of quartz/bitumen emulsion as described herein over the conventional use of quartz only in noise reduction devices, various ratios of quartz/bitumen emulsion were compared to the use of quartz only. Cylinders of carbon fibers filled with quartz/bitumen emulsion ratios varying between 50/50 and 100/0 were prepared. The differential SNRs obtained for the range of 50/50 to 100/0 are illustrated in FIG. 5. These values were obtained using filters having cylindrical casings of length 33 cm and diameter 50 mm, for a total volume of about 648 cm$^3$. Various total volumes were also tested, as illustrated in FIG. 4. These tests were run with a quartz/bitumen ratio of 67/33.

Various aspects described herein may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. Although particular embodiments have been shown and described, it will be apparent to those skilled in the art that changes and modifications may be made without departing from this invention in its broader aspects. The scope of the following claims should not be limited by the embodiments set forth in the examples, but should be given the broadest reasonable interpretation consistent with the description as a whole.

The invention claimed is:

1. A power distribution device comprising:
   a supporting structure;
   a power input connector mounted to the supporting structure, the power input connector having at least two input contacts;
   a power output connector mounted to the supporting structure, the power output connector having at least two output contacts corresponding to the at least two input contacts;
   a plurality of elongated filters mounted inside the supporting structure, each one of the filters comprising a hollow casing filled with a mixture composed of quartz and bitumen emulsion, wherein a percent of bitumen emulsion of a total volume of the mixture is greater than 0% and no more than 50%; and
   wire connections to define first electric paths from the input contacts to the elongated filters and second electric paths from the elongated filters to the output contacts.

2. The device of claim 1, wherein the power input connector comprises three input contacts, the power output connector comprises three output contacts, and the elongated filters comprises three filters.

3. The device of claim 1, further comprising a plurality of additional power output connectors, and wherein the wire connections define third electric paths from the power output connector to the additional output connectors.

4. The device of claim 1, wherein the mixture comprises a ratio quartz/bitumen emulsion in percent of total volume from 60/40 to 90/10.

5. The device of claim 1, wherein the mixture comprises a ratio quartz/bitumen emulsion in percent of total volume from 65/35 to 80/20.

6. The device of claim 1, wherein the mixture comprises a ratio quartz/bitumen emulsion in percent of total volume of 67/33.

7. The device of claim 1, wherein the hollow casing is made of carbon fiber.

8. The device of claim 1, wherein the supporting structure comprises ballistic nylon.

9. A method for suppressing noise in an electrical signal, the method comprising:
   receiving alternating current at a power distribution device through a power input connector having at least two input contacts;
   filtering the alternating current through a plurality of elongated filters inside the power distribution device, each one of the filters comprising a hollow casing filled with a mixture composed of quartz and bitumen emulsion, wherein a percent of bitumen emulsion of a total volume of the mixture is greater than 0% and no more than 50%; and
   distributing the filtered alternating current through a power output connector having at least two output contacts corresponding to the at least two input contacts.

10. The method of claim 9, wherein the mixture comprises a ratio quartz/bitumen emulsion in percent of total volume from 60/40 to 90/10.

11. The method of claim 9, wherein the mixture comprises a ratio quartz/bitumen emulsion in percent of total volume from 65/35 to 80/20.

12. The method of claim 9, wherein the mixture comprises a ratio quartz/bitumen emulsion in percent of total volume of 67/33.

13. The method of claim 9, wherein the hollow casing is made of carbon fiber.

* * * * *